United States Patent
Chen et al.

(10) Patent No.: US 7,495,920 B2
(45) Date of Patent: Feb. 24, 2009

(54) HEAT DISSIPATION DEVICE

(75) Inventors: Yong-Dong Chen, Shenzhen (CN);
Guang Yu, Shenzhen (CN); Shih-Hsun Wung, Taipei Hsien (TW); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 68 days.

(21) Appl. No.: 11/614,766

(22) Filed: Dec. 21, 2006

(65) Prior Publication Data

US 2008/0151505 A1  Jun. 26, 2008

(51) Int. Cl.
*H05K 7/20* (2006.01)
*H01L 23/36* (2006.01)

(52) U.S. Cl. .......... 361/719; 361/695; 361/697; 361/709; 165/80.3; 165/121

(58) Field of Classification Search ........... 361/687, 361/717–722, 756, 775; 165/80.3, 80.4, 165/121–126, 104.33, 104.34, 185; 454/184; 257/706–727; 174/16.1, 16.3, 252; D13/152
See application file for complete search history.

(56) References Cited

U.S. PATENT DOCUMENTS

| | | | |
|---|---|---|---|
| 3,592,260 A * | 7/1971 | Berger | 165/121 |
| 6,313,399 B1 * | 11/2001 | Suntio et al. | 174/17 VA |
| 6,408,934 B1 | 6/2002 | Ishida et al. | |
| 6,418,020 B1 * | 7/2002 | Lin | 361/703 |
| 6,421,239 B1 * | 7/2002 | Huang | 361/696 |
| 6,671,177 B1 * | 12/2003 | Han | 361/719 |
| 6,699,312 B2 * | 3/2004 | Hayashi et al. | 106/31.26 |
| 6,778,390 B2 * | 8/2004 | Michael | 361/695 |
| 6,819,564 B2 | 11/2004 | Chung et al. | |
| 6,967,845 B2 * | 11/2005 | Chiang et al. | 361/709 |
| 7,079,390 B2 * | 7/2006 | Barr et al. | 361/690 |
| 7,198,094 B2 * | 4/2007 | Barsun et al. | 165/80.3 |
| 7,269,014 B1 * | 9/2007 | Zhao et al. | 361/700 |
| 2003/0081382 A1 * | 5/2003 | Lin | 361/697 |
| 2006/0039113 A1 | 2/2006 | Cheng et al. | |

FOREIGN PATENT DOCUMENTS

JP  01133338 A  *  5/1989

* cited by examiner

*Primary Examiner*—Michael V Datskovskiy
(74) *Attorney, Agent, or Firm*—Frank R. Niranjan

(57) ABSTRACT

A heat dissipation device is used for dissipating heat from a CPU and electronic components. The heat dissipation device includes a heat absorbing portion for absorbing heat from the CPU, and a heat sink located on the heat absorbing portion. The heat sink includes a plurality of curved fins defining a plurality of curved passages therebetween. An airflow source is located adjacent to the heat sink for providing forced airflow to the heat sink. A direction of the airflow from the airflow source is changed when it passes through the passages. A direction of the airflow out of the passages is perpendicular to a direction of the airflow into the passages. The airflow out of the heat sink further flows to the electronic components located adjacent to the CPU.

18 Claims, 3 Drawing Sheets

HEAT DISSIPATION DEVICE

BACKGROUND OF THE INVENTION

1. Field of the Invention

The present invention relates generally to heat dissipation devices, and more particularly to a heat dissipation device used for dissipating heat generated by electronic devices.

2. Description of Related Art

It is well known that, during operation of a computer, electronic devices such as central processing units (CPUs) frequently generate large amounts of heat. The heat must be quickly removed from the electronic device to prevent it from becoming unstable or being damaged. Typically, a heat dissipation device is attached to an outer surface of the electronic device to absorb heat from the electronic device. The heat absorbed by the heat dissipation device is then dissipated to ambient air.

Generally, the heat dissipation device mainly comprises a heat conducting base and a plurality of heat dissipating fins extending from one face of the base. In use, the base has a face on a side opposite to the fins which is attached to the electronic device and absorbs heat generated by the electronic device, and the heat is then transmitted from the base to the fins and is finally dissipated to ambient air via the fins.

During operation of an electronic device such as a computer central processing unit (CPU) in a computer enclosure, large amounts of heat are often produced. The heat must be quickly removed from the CPU to prevent it from becoming unstable or being damaged. Typically, an airflow device such as a fan is used to create an airflow over the fins thus facilitating heat dissipation from the heat sink. However, increases in CPU operational speeds now mean that this kind of heat dissipation arrangement is incapable of dealing with modern CPU heat production. Furthermore, more and more electronic devices in the computer enclosure need heat dissipation; the foresaid heat dissipation device cannot give available heat dissipation to these electronic devices.

What is needed, therefore, is a heat dissipation device which can achieve a greater rate of heat dissipation for electronic devices in a computer enclosure.

SUMMARY OF THE INVENTION

A heat dissipation device in accordance with a preferred embodiment of the present invention is used for dissipating heat from a CPU and electronic components located adjacent to the CPU located on a printed circuit board. The heat dissipation device comprises a heat absorbing portion for contacting the CPU and absorbing heat from the CPU, and a heat sink located on the heat absorbing portion. The heat sink comprises a plurality of curved fins defining a plurality of curved passages therebetween. Each of the passages has an outlet at one end thereof and an inlet at another end thereof. An airflow source is located adjacent to the heat sink and conforms to the inlets of the passages of the heat sink thus providing forced airflow to the heat sink. A direction of the airflow from the airflow source is changed when it passes through the passages of the heat sink. A direction of the airflow out of the outlets of the passages of the heat sink is perpendicular to a direction of the airflow into the inlets of the passages of the heat sink. The airflow out of the heat sink further flows to the electronic components located adjacent to the CPU.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
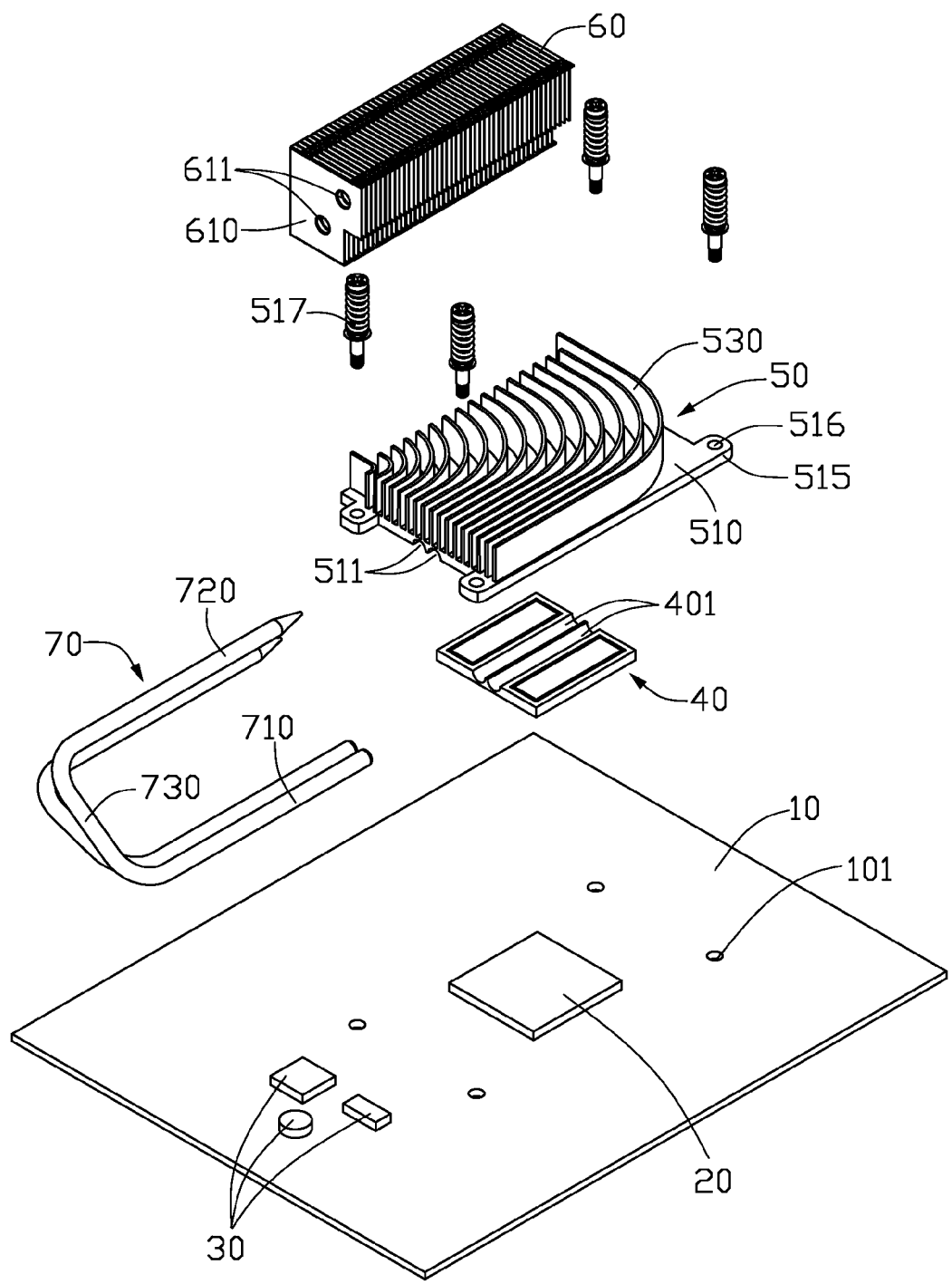
FIG. 1 is an exploded, isometric view of a heat dissipation device in accordance with a preferred embodiment of the present invention, together with a CPU and electronic components mounted on a printed circuit board.
Figure 2:
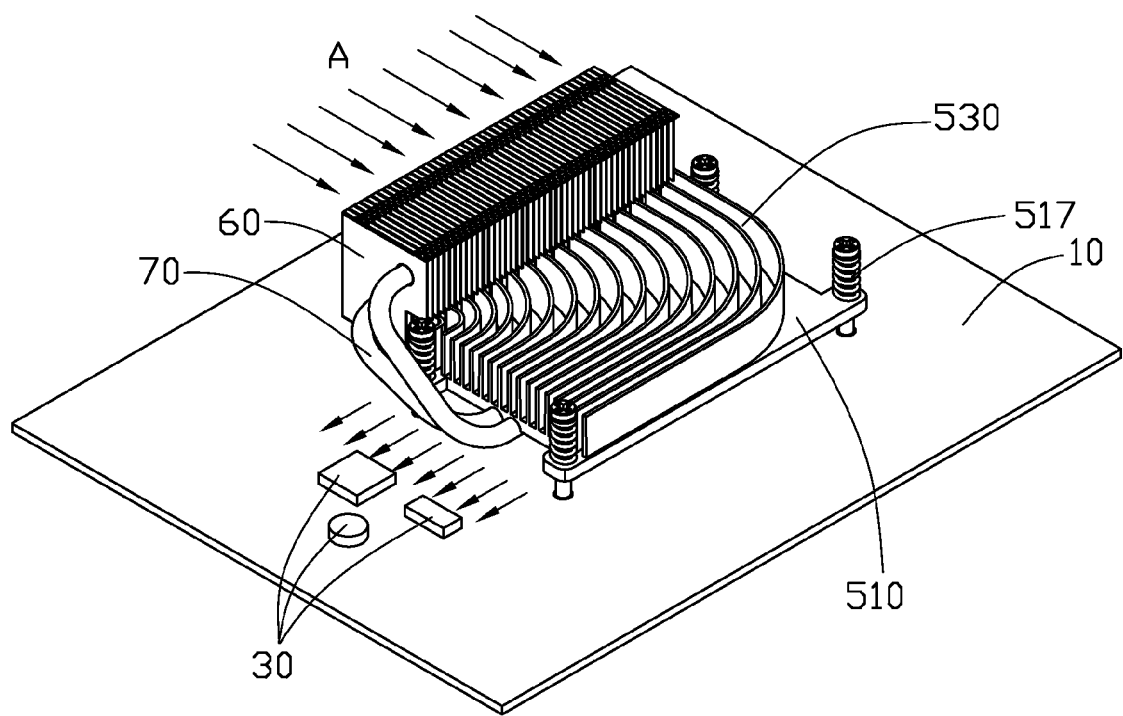
FIG. 2 is an assembled view of FIG. 1.
Figure 3:
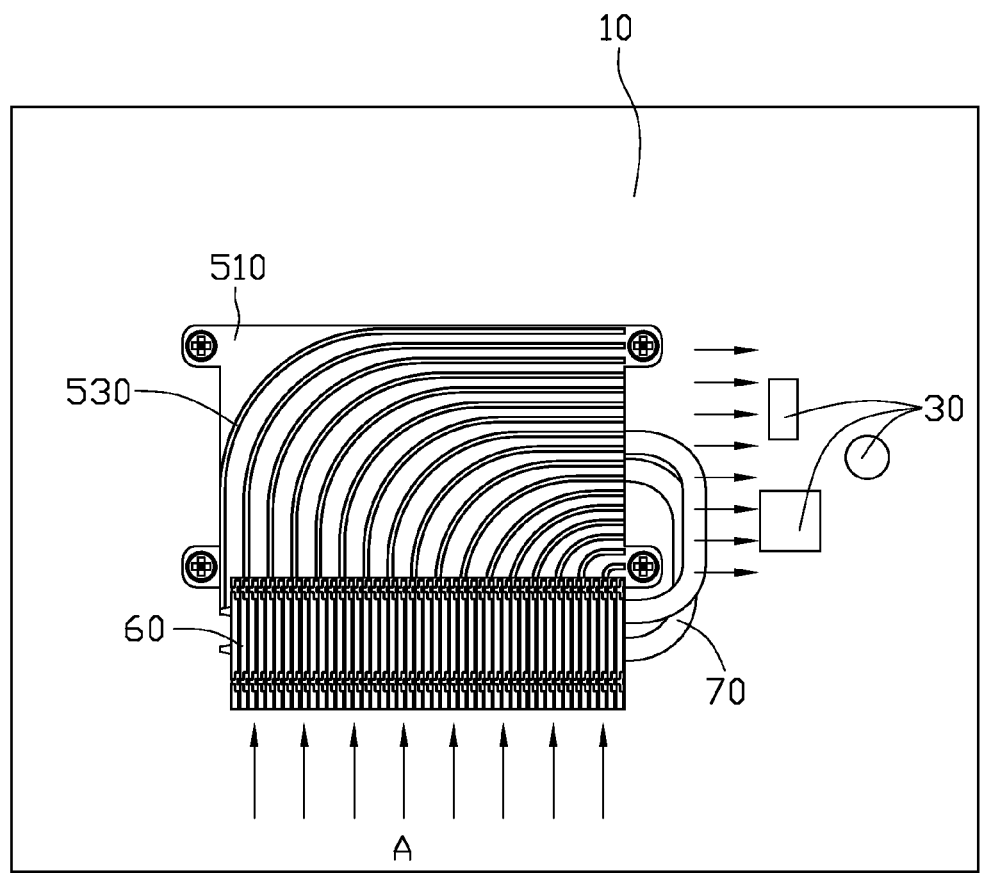
FIG. 3 is a top plan view of FIG. 2.

Referring to FIGS. 1-3, a heat dissipation device in accordance with a preferred embodiment of the invention is used for dissipating heat generated by a CPU 20 and electronic components 30 located adjacent to the CUP 20 mounted on a printed circuit board 10. The heat dissipation device comprises a heat absorbing portion 40 for absorbing heat from the CPU 20, a heat sink 50 located on the heat absorbing portion 40, a fin set 60 located adjacent to the heat sink 50, two heat pipes 70 thermally connecting the heat absorbing portion 40, the heat sink 50 and the fin set 60, and an airflow source A for providing airflow to the fin set 60 and the heat sink 50.

The heat absorbing portion 40 is a substantially rectangular metal plate having excellent heat conductivity, such as a copper plate, aluminum plate or the like. The heat absorbing portion 40 has a top defining two parallel grooves 401 for receiving the heat pipes 70 therein. Each groove 401 has a semicircular section.

The heat sink 50 comprises a base 510 and a plurality of curved fins 530 extending from a top face of the base 510. A bottom face of the base 510 defines two parallel grooves 511 corresponding to the grooves 401 of the heat absorbing portion 40, for receiving the heat pipes 70 therein. The base 510 has four fixing legs 515 extending from corresponding four corners thereof. A fixing hole 516 is defined in each of the fixing legs 515 for accommodating a fastener 517 therein. The fastener 517 is for extending through a fixing aperture 101 defined in the printed circuit board 10 and engaging with a retaining plate (not shown) located at a bottom of the printed circuit board 10, thereby fixing the heat sink 50 to the printed circuit board 10 and the CPU 20. Each fin 530 has a first portion (not labeled), a second portion (not labeled) substantially perpendicular to the first portion, and an arced middle portion smoothly connecting the first and second portions. The fins 530 substantially occupies a whole top face of the base 510 which has a rectangular configuration; furthermore, the fins 530 are uniform in height but gradually decrease in length from one side to an opposite side of the heat sink 50. The fins 530 define a plurality of curved passages (not labeled) therebetween. The passages are essentially identical to their corresponding fins 530. Each of the passages has an inlet (not labeled) at one end thereof for airflow from the airflow source A into the passage and an outlet (not labeled) for the airflow out of the passage at another end thereof.

Airflow into the inlet is substantially perpendicular to airflow out of the outlet. The fins 530 are flushed at the inlets but ends of the two outmost fins 530 project beyond the corresponding ends of the other fins 530 between the two outmost fins 530. Corresponding ends of the fins 530 are flushed at the outlets.

The fin set 60 comprises a plurality of fins (not labeled) assembled together. Each fin of the fin set 60 has a body 610 and two flanges (not labeled) extending from two opposite edges of the body 610. Each of the fins is substantially L-shaped in profile. Upper and lower through holes (not labeled) are defined in the body 610 of each fin. The corresponding through holes of the bodies 610 of the fins cooperatively define upper and lower through channels 611 extending through the fin set 60 for receiving the heat pipes 70 therein. An upper portion of the fin set 60 projects beyond its corresponding bottom portion of the fin set 60, and is located on the fins 530 of the heat sink 50. A plurality of passages (not labeled) is defined between adjacent fins of the fin set 60. The passages of fin set 60 are in communication with the passages of the heat sink 50.

Each heat pipe 70 is substantially U-shaped, and comprises a first section 710, a second section 720 parallel to the first section 710, and a connecting section 730 connecting the first, second sections 710,720. A round corner (not labeled) is formed at a joint of the first, connecting, and second sections of each heat pipe 70.

In assembly, the heat sink 50 has the bottom face thereof thermally contacting the top face of the heat absorbing portion 40. The fin set 60 has the upper portion thereof located on the fins 530 of the heat sink 50 and other portion thereof located adjacent to the heat sink 50. The first sections 710 of the two heat pipes 70 are thermally received in corresponding grooves 401 of the heat absorbing portion 40 and the grooves 511 of the heat sink 50. The second sections 720 of the heat pipes 70 are thermally received in corresponding through channels 611 of the fin set 60. The connecting sections 730 of the heat pipes 70 are located at a lateral side of the heat sink 50 and the fin set 60. The airflow source A such as a system fan or a CPU fan conforming to the passages of the fin set 60 is located at a side of the fin set 60 for providing forced airflow to the fin set 60 and the heat sink 50.

In use, the heat absorbing portion 40 of the heat dissipation device has the bottom face thereof contacting the CPU 20. The heat dissipation device is fixed to the printed circuit board 10 via the fasteners 517 engaged with the retaining plate (not shown) at the bottom of the printed circuit board 10, with the outlets of the passages of the heat sink 50 confronting to the electronic components 30. The heat absorbing portion 40 absorbs heat from the CPU 20. The heat in the heat absorbing portion 40 is partly transferred to the heat sink 50 and partly is absorbed by the first sections 710 of the heat pipes 70. The heat in the first sections 710 of the heat pipes 70 reaches the fin set 60 via the connecting sections 730 and the second sections 720 of the heat pipes 70. The airflow from the airflow source A passes through the passages of the fin set 60 and the heat sink 50 and removes the heat in the fin set 60 and the heat sink 50. The airflow out of heat sink 50 further flows to the electronic components 30 which face the outlets of the passages of the heat sink 50. Subsequently, heat generated by the electronic components 30 is removed by the airflow.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat absorbing portion for absorbing heat from a heat generating device;
   a heat sink located on the heat absorbing portion and comprising a plurality of curved fins defining a plurality of curved passages therebetween, the passages each having an outlet at one end thereof and an inlet at another end thereof; and
   an airflow source conforming to the inlets of the passages of the heat sink for providing forced airflow to the heat sink;
   wherein a direction of the airflow from the airflow source is changed by the passages of the heat sink, a direction of the airflow out of the outlets of the passages of the heat sink are oriented substantially perpendicular to a direction of the airflow into the inlets of the passages of the heat sink;
   wherein each of the fins of the heat sink comprises a first section, a second section and an arced middle section smoothly connecting the first section and the second section; and
   wherein ends of the fins of the heat sink are flushed at the inlets of the passages of the heat sink but the ends of two outmost fins at the inlets project beyond the ends of the other fins between the two outmost fins.

2. The heat dissipation device of claim 1, wherein the second section of each of the fins of the heat sink is substantially perpendicular to the first section of each of the fins of the heat sink.

3. The heat dissipation device of claim 1, wherein the fins of the heat sink gradually decrease in length from one side to an opposite side of the heat sink.

4. The heat dissipation device of claim 1, wherein the fins of the heat sink are uniform in height.

5. The heat dissipation device of claim 1, wherein the heat sink comprises a base contacting the heat absorbing portion, the fins extending from the base.

6. The heat dissipation device of claim 5 further comprising a heat pipe, wherein the heat pipe comprises a first section thermally located between the heat absorbing portion and the base of the heat sink.

7. The heat dissipation device of claim 6 further comprising a fin set having a portion thereof located adjacent to the heat sink, wherein the heat pipe has a second section thermally contacting the fin set.

8. An electronic system comprising:
   a printed circuit board;
   an electronic device located on the printed circuit board;
   a plurality of electronic components located adjacent to the electronic device on the printed circuit board;
   a heat absorbing portion having a face contacting the electronic device for absorbing heat from the electronic device;
   a heat sink located on the heat absorbing portion, the heat sink comprising a plurality of curved fins, a plurality of curved passages being defined between the fins; and
   an airflow source located adjacent to the heat sink for providing airflow to the heat sink;
   wherein a direction of the airflow from the airflow source is changed when the airflow passes through the passages of the heat sink, and the airflow out of the heat sink further flows to the electronic components located adjacent to the electronic device; and
   wherein each of the passages of the heat sink has an airflow inlet and an airflow outlet at two ends thereof, and ends of the fins of the heat sink are flushed at the airflow inlets of the passages of the heat sink but the ends of two outmost fins at the airflow inlets project beyond the ends of the other fins between the two outmost fins.

9. The electronic system of claim 8, wherein each of the fins of the heat sink has two ends substantially perpendicular to each other, and an arced portion connecting with the two ends thereof.

10. The electronic system of claim 9, wherein the airflow outlet is substantially perpendicular to the airflow inlet.

11. The electronic system of claim 8, wherein the heat sink comprises a base thermally contacting the heat absorbing portion, the fins integrally extending from the base.

12. The electronic system of claim 11 further comprising at least a heat pipe, wherein the at least a heat pipe comprises a first section located between the base of the heat sink and the heat absorbing portion.

13. The electronic system of claim 12 further comprising a fin set, wherein the at least a heat pipe comprises a second section extending through the fin set for transferring heat from the first section of the at least a heat pipe to the fin set.

14. The electronic system of claim 13, wherein the fin set comprises a plurality of fins assembled together, a plurality of passages being defined between the fins to allow the airflow from the airflow source to pass therethrough.

15. A heat dissipation device comprising:
a heat sink comprising a plurality of curved fins defining a plurality of curved passages therebetween, the passages each having an outlet at one end thereof and an inlet at another end thereof; wherein ends of the fins are flushed at the inlets of the passages but the ends of two outmost fins at the inlets project beyond the ends of the other fins between the two outmost fins.

16. The heat dissipation device of claim 15 further comprising a heat absorbing portion, wherein the heat sink is located on the heat absorbing portion.

17. The heat dissipation device of claim 16, wherein the heat sink and the heat absorbing portion have a heat pipe sandwiched therebetween.

18. The heat dissipation device of claim 15 further comprising an airflow source, wherein the airflow source conforms to the inlets of the passages of the heat sink for providing forced airflow to the heat sink.

* * * * *